United States Patent [19]

Naunheim et al.

[11] Patent Number: 5,530,201
[45] Date of Patent: Jun. 25, 1996

[54] SHIELDING FOR OPENINGS IN A SHIELDED HOUSING, PARTICULARLY A MONITOR SHIELDING

[75] Inventors: Hans-Dieter Naunheim, Kobern-Gondorf; Rainer Kuth, Herzogenaurach; Martin Kohl, Langensendelbach, all of Germany

[73] Assignee: Vacuumschmelze GmbH, Hanau, Germany

[21] Appl. No.: 326,193

[22] Filed: Oct. 20, 1994

[30] Foreign Application Priority Data

Nov. 10, 1993 [DE] Germany ............... 43 38 323.8

[51] Int. Cl.⁶ .................................................. H05K 9/00
[52] U.S. Cl. ................... 174/35 R; 174/35 CE; 361/818
[58] Field of Search ............... 174/35 R, 35 CE; 361/600, 800, 816, 818; 439/607, 608, 609

[56] References Cited

U.S. PATENT DOCUMENTS

| 1,942,575 | 1/1934 | Shapiro ........................... 174/35 CE |
| 2,340,081 | 1/1944 | Sauer ........................... 174/35 CE X |
| 2,463,778 | 12/1943 | Uelogg ........................... 124/35 CE |
| 2,470,805 | 5/1949 | Collard ........................... 178/44 |
| 2,515,333 | 7/1950 | Buddington ........................... 250/27 |
| 3,678,428 | 7/1972 | Morris et al. ........................... 174/35 CE X |
| 4,375,627 | 3/1983 | Hansen et al. ........................... 174/35 CE X |
| 4,701,801 | 10/1987 | Hobbins et al. ........................... 353/245 |

FOREIGN PATENT DOCUMENTS

| 0250250 | 12/1987 | European Pat. Off. . |
| 2146071 | 3/1973 | Germany . |
| 2446986 | 12/1977 | Germany . |

*Primary Examiner*—Kristine L. Kincaid
*Assistant Examiner*—Christopher Horgan
*Attorney, Agent, or Firm*—Hill Steadman & Simpson

[57] ABSTRACT

Shielding for openings of shielded housings, particularly monitors, has a frame of soft-magnetic material arranged in front of the opening, an electrical coil whose current, controlled by magnetic field sensors, compensates penetrating noise fields in a direction substantially normal to the plane of the opening, with the turns of the coil being located at the inside of the frame.

3 Claims, 2 Drawing Sheets

5,530,201

SHIELDING FOR OPENINGS IN A SHIELDED HOUSING, PARTICULARLY A MONITOR SHIELDING

BACKGROUND OF THE INVENTION

1. Field of the Invention

The invention is directed to a shielding for openings in shielded housing, particularly for shielding the viewing opening of a monitor, using soft-magnetic materials in combination with an electrical coil for compensating noise fields, the current of the coil being set dependent on the influencing magnetic field.

2. Description of the Prior Art

For shielding electromagnetic devices, European Application 250 250 discloses surrounding the device with a shielding housing of a hardenable compound, which can be electrically conductive or soft-magnetic due to inclusions of metals or due to a metal coating. For shielding the opening, for example the viewing opening of a monitor or of a television set, this European application that a shield of transparent material be employed which, for example, can comprise a metal coat. Such a shielding for the viewing opening of a monitor, however, has the disadvantage that either the metal coat must be kept extremely thin or the metal coat must be applied in the form of lattice in order to retain good light transmissivity. In any case, the light transmissivity is degraded, this being particularly unbeneficial for color monitors that are present in spaces having strong magnetic fields.

For shielding rooms, it is likewise generally known from German OS 21 46 071 to provide a coil system that is supplied with a current via sensors dependent on the magnetic field. This current is controlled such that the magnetic field it generates is directed oppositely to the disturbing magnetic field.

German OS 24 46 986 also discloses that such known electrical coils influenced by magnetic field sensors additionally be provided in rooms shielded by soft-magnetic or electrically conductive material in order to improve the shielding effect.

SUMMARY OF THE INVENTION

It is an object of the present invention, in the employment of shielding techniques using soft-magnetic and/or electrically conductive material in combination with compensation coils, to provide an especially advantageous arrangement specifically for shielding openings in shielded housings without the view through the opening being degraded in any way whatsoever.

This object is inventively achieved in a shielded housing having an opening with a frame of soft-magnetic material arranged in front of the opening, and having a compensating electrical coil with the turns of the electrical coil proceed along the inside wall of the frame of soft-magnetic material.

DESCRIPTION OF THE PREFERRED EMBODIMENTS

Figure 1:
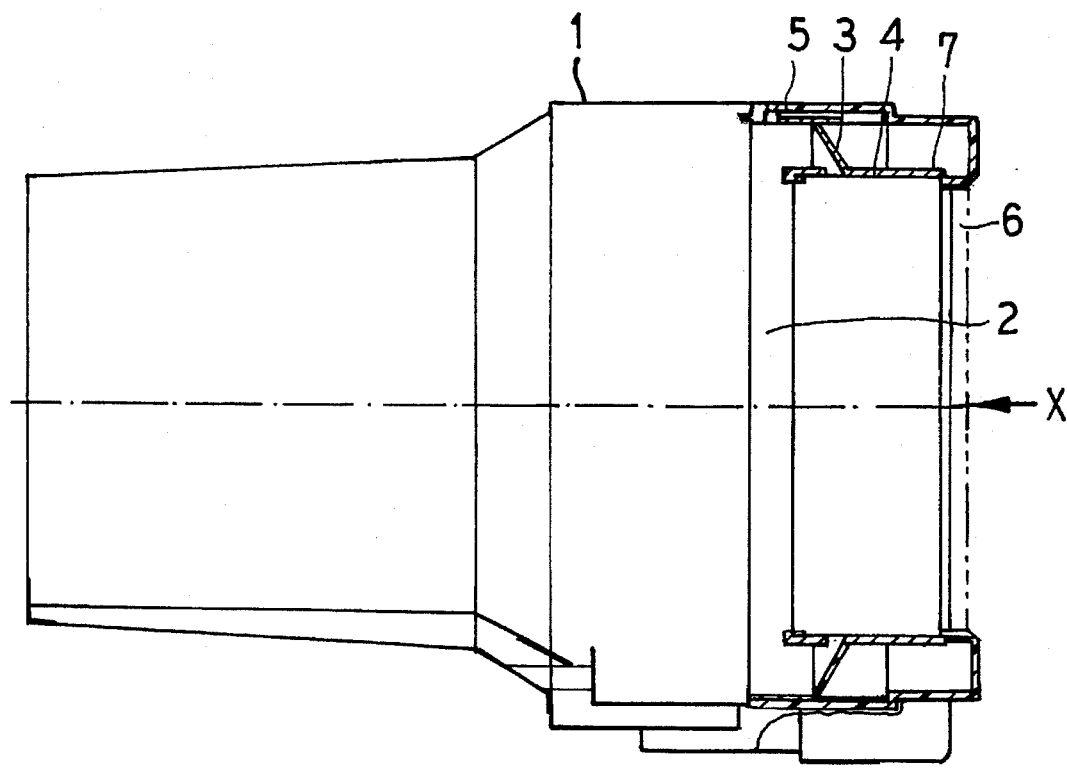
FIG. 1 is a side view of an exemplary embodiment of the invention incorporated in a color monitor.
Figure 2:
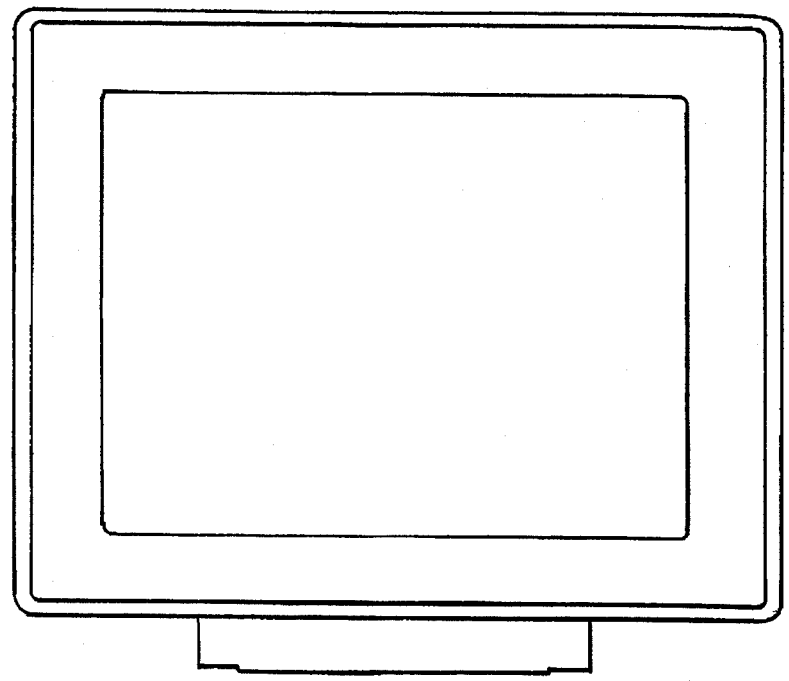
FIG. 2 is a front view looking toward the shielding opening of the color monitor of FIG. 1.
Figure 3:
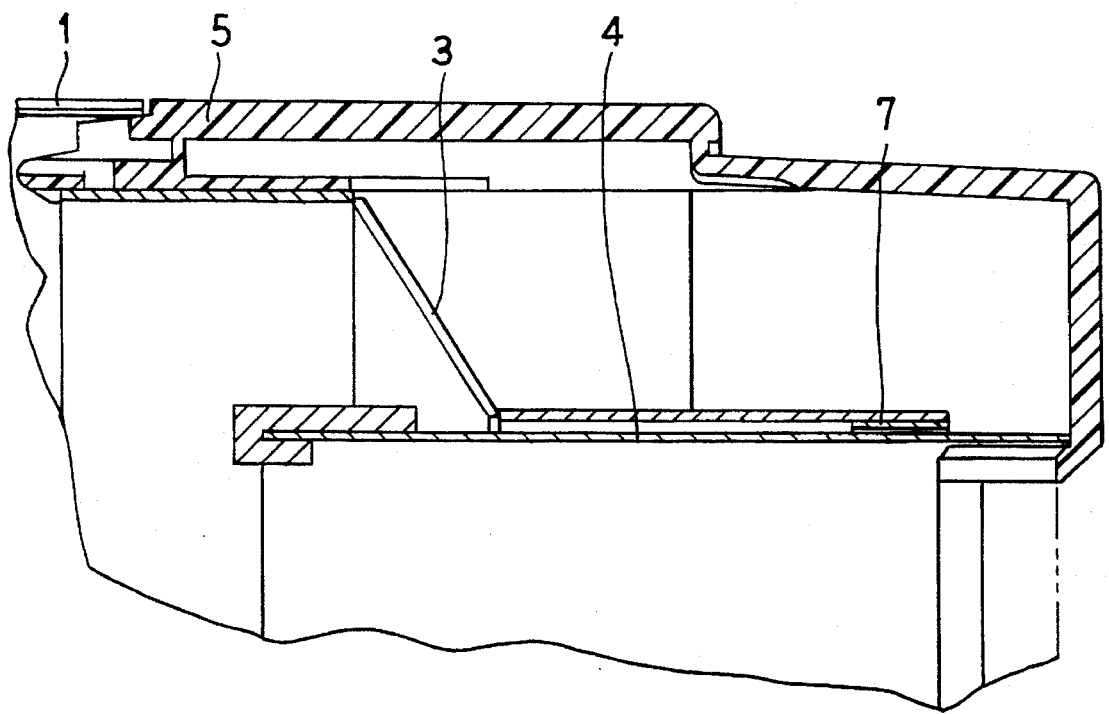
FIG. 3 shows a detail of a portion of the color monitor of FIG. 1.

For shielding, the volume shown in FIG. 1 is surrounded by a housing 1 of soft-magnetic material, for example mu-metal. The housing 1 is provided for the acceptance of a monitor and has an opening 2 in order to guarantee an unobstructed view onto the front panel of the monitor. A frame 3 of soft-magnetic material is arranged in front of this opening 2. A coil 7 has turns that carry a current in a known way—for example, controlled by a magnetic field sensor—that compensates penetrating noise fields in the direction of the arrow x. The turns of the coil 7 are arranged at the insides of the opening 2, preferably in the region facing away from the opening 2. For additionally improving the shielding effect, a further frame 4 of electrical material, for example aluminum, is provided, this being in turn located inside the soft-magnetic frame 3 and inside the coil 7. The frame 4 can simultaneously serve the purposes of carrying the coil 7 and carrying the soft-magnetic frame 3. For rounding the exterior appearance, a plastic front mask 5 is also provided that, however, contributes nothing to the shielding effect insofar as it is composed of insulator material.

The inventive application of the turns of the coil 4 directly to the inside of the soft-magnetic frame 3 results in the fact that the entire opening 2 is shielded by the coil 7. The shielding effect is greater the more the direction of the noise field corresponds to the direction of the arrow x. For fields that deviate more or less from this direction, the shielding effect of the coil 7 will be less; as compensation for this, a substantial reduction in the size of the opening for fields directed in this way occurs in that the frame 4 has an extent in the x-direction of, for example, 10 cm given a dimension of the opening of 40 cm. Noise fields having a direction deviating from the x-direction then impinge the electrically conductive frame 4 or the magnetically conductive frame 3 before they pass through the opening 2, so that these frames also produce a shielding effect for the incident magnetic fields that penetrate through the outer opening 6.

An extremely good shielding effect can therefore be achieved on the basis of the inventive combination of a frame of magnetic and/or electrically conductive material placed in front of the opening in combination with a coil adjacent to the frame for active compensation of noise fields without the length of the frame in the x-direction having to be selected large in comparison to the currents of the opening to be covered.

Although modifications and changes may be suggested by those skilled in the art, it is the intention of the inventors to embody within the patent warranted hereon all changes and modifications as reasonably and properly come within the scope of their contribution to the art.

We claim as our invention:

1. A shielding for a housing having an opening disposed in a plane, comprising:

a frame of soft-magnetic material disposed in front of and surrounding said opening, said frame having an inside wall surrounding said opening; and electrical coil means, supplied with current which is set dependent on a magnetic field to be shielded oriented in a direction substantially normal to said plane, for compensating said magnetic field, said electrical coil means having a plurality of turns and said turns proceeding along said inside wall of said frame.

2. A shielding as claimed in claim 1 further comprising a further frame, of electrically conductive material, surrounding said opening adjacent said frame of soft-magnetic material and carrying said frame of soft-magnetic material.

3. A shielding as claimed in claim 1 wherein said inside wall has a side facing away from said opening, and wherein said turns of said electrical coil are disposed on said side of said inside wall.

\* \* \* \* \*